United States Patent [19]

Dunnrowicz et al.

[11] Patent Number: 4,895,290

[45] Date of Patent: Jan. 23, 1990

[54] METHOD FOR BONDING MATERIALS

[75] Inventors: Clarence J. Dunnrowicz, Los Angeles, Calif.; Joseph Callerame, Lexington, Mass.

[73] Assignee: Raytheon Company, Lexington, Mass.

[21] Appl. No.: 837,326

[22] Filed: Mar. 3, 1986

Related U.S. Application Data

[60] Continuation of Ser. No. 538,637, Oct. 3, 1983, abandoned, which is a division of Ser. No. 214,534, Dec. 8, 1980, Pat. No. 4,434,384.

[51] Int. Cl.[4] ........................ B23K 20/24; H01L 41/22

[52] U.S. Cl. ................................ 228/116; 228/263.12; 228/205; 228/218; 228/221; 228/124

[58] Field of Search ............... 228/116, 121, 124, 205, 228/206, 221, 263.12, 218

[56] References Cited

U.S. PATENT DOCUMENTS

| | | | |
|---|---|---|---|
| 3,066,232 | 11/1962 | Branson | 310/325 |
| 3,916,836 | 10/1975 | Hafner et al. | 228/205 X |
| 3,921,885 | 11/1975 | Knox | 228/116 |
| 4,196,837 | 4/1980 | Burkart et al. | 228/116 |
| 4,245,768 | 1/1981 | Sater | 228/116 |
| 4,247,034 | 1/1981 | Burkhart et al. | 228/116 |
| 4,355,084 | 10/1982 | Kitchen | 228/205 X |

FOREIGN PATENT DOCUMENTS 1503769 3/1978 United Kingdom .

OTHER PUBLICATIONS

Federal Standard 209B entitled, "Clean Room and Work Station Requirements, Controlled Environment", General Services Administration of the USA, pp. 1–5 and cover sheet; Aug. 10, 1966.

*Primary Examiner*—Kenneth J. Ramsey

[57] ABSTRACT

An ultrasonic transducer and its method of fabrication wherein bonding between an impedance matching layer on one side of a piezoelectric layer and a support layer on the other side of the piezoelectric material is made by providing onto each material a smooth, thin gold film on the smooth surfaces of the layers which are to be in contact with one another in the assembled transducer. The layers are bonded to each other by the gold films under moderate temperature and pressure to form the transducer. Sawing of the impedance matching and piezoelectric layers into a plurality of parallel transducers attached to the support layer forms an array.

12 Claims, 1 Drawing Sheet

FIG. 1
PRIOR ART
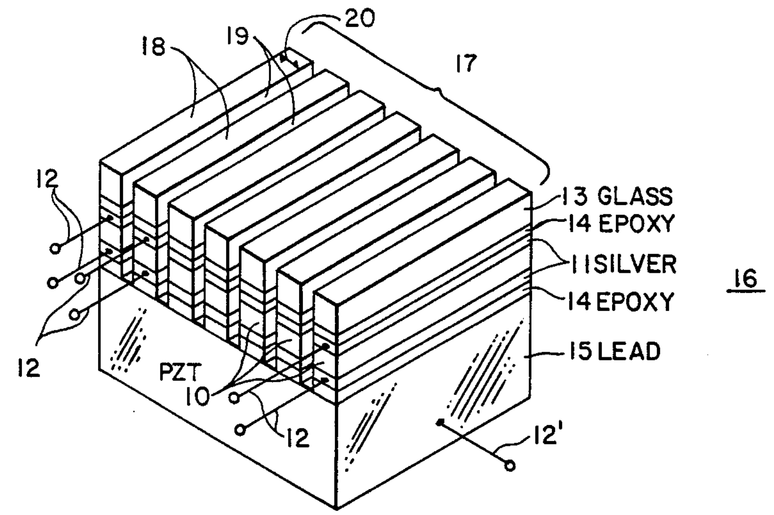
FIG. 2
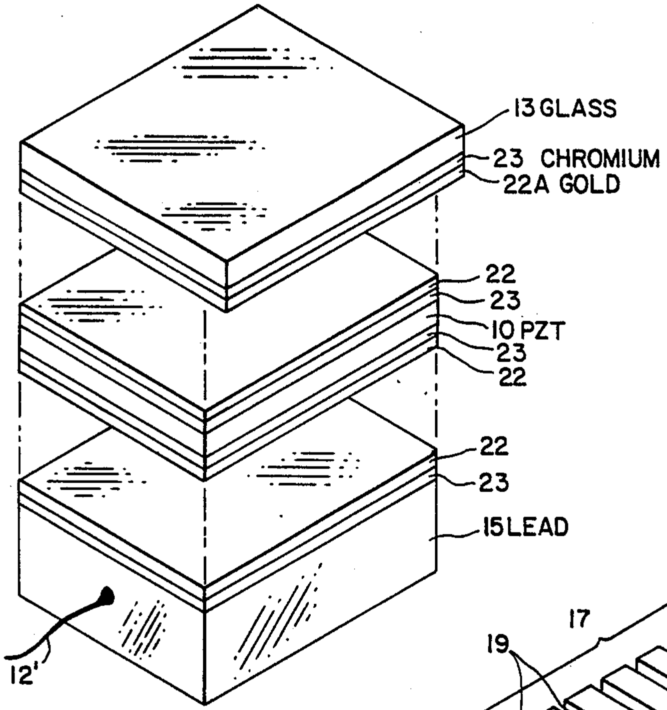
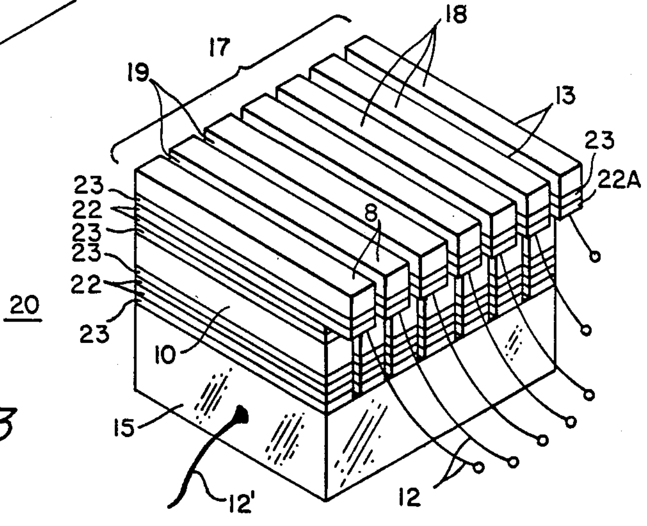
FIG. 3

METHOD FOR BONDING MATERIALS

CROSS-REFERENCE TO RELATED APPLICATION

This application is a continuation of application Ser. No. 538,637 filed Oct. 3, 1983, now abandoned, which is a division of application Ser. No. 214,534, filed Dec. 8, 1980, now U.S. Pat. No. 4,434,384.

BACKGROUND OF THE INVENTION

This invention relates to ultrasonic transducers and their method of fabrication and more particularly to an improved technique for bonding the layer of piezoelectric material to its supporting layer and to its impedance matching layer.

Typically, a prior art transducer 16 of the lead-zirconate-titanate (PZT) type suitable for use in medical ultrasonics has been fabricated as shown in FIG. 1. A layer 10 of PZT has silver electrodes 11 deposited on both sides of the PZT layer 10. Electrical leads 12 are connected to the silver electrodes 11 in order to allow electrical energization of the piezoelectric material. A glass layer 13 is bonded by an epoxy layer 14 to the silver electrode 11 on the upper side of the PZT layer 10 in order to provide acoustic impedance matching between the PZT layer 10 and the water of the container in which the transducer 16 is placed when it is being used. A supporting layer 15 is attached by the epoxy layer 14 to-the silver electrode 11 on the lower side of the PZT layer 10. The supporting layer 15 typically of lead, serves to broaden the bandwidth and to absorb energy generated by the layer 10 and thus prevent reflections within the transducer. The epoxy layers 14, 16 are desired to be as thin as possible to minimize distortion of the acoustic wave passing through the layers 14, 16, such distortions being significant even for epoxy layers having thicknesses of approximately one half mil.

A transducer array 17 is comprised of individual transducer elements 18, each of which includes the layer of glass 13 and PZT piezoelectric layer 11, both mounted to a supporting layer 15. The layer of glass 13, the PZT piezoelectric layer 10 and the supporting layer 15 are initially epoxy bonded to each other to form a large area transducer after which a diamond saw is used to cut slits 19 through the glass layer 13 and the PZT piezoelectric layer 10 to form the individual radiating elements 18 of a linear transducer array 17, as shown. Typically, each one of the transducer elements 18 has a length of 8 mm and a width 20 of 2.5 mm. The elements 18 are spaced from each other by the width of the saw cut of slot 19 of approximately 0.1 mm.

It has been found that the structural reliability of the prior art transducer array fabricated as described is rather poor with bond failure often occurring especially at the PZT/glass interface. The failure often occurs during the sawing operation while forming the elements 18, or shortly thereafter when the transducer is being operated in its normal water environment.

It is believed that the poor reliability obtained with an epoxy bond is a result of a number of factors. Lateral cracking at the edges of the elements 18 is produced during the sawing operation. The effect of this cracking becomes more severe as the width 20 of the element decreases to 1-3 mm as desired in the transducer of this invention. The brittle nature of the epoxy bond 14 leads to further stress concentration effects. Further, it is a well established fact that the bond strength is often seriously degraded when subject to stress in a water environment in which the transducer to which the invention is directed is commonly employed.

SUMMARY OF THE INVENTION

It is a primary object of this invention to provide an improved transducer array which is more reliable and resistant to degradation or failure during fabrication and use than those of the prior art. It is a further object of this invention to provide a transducer array in which the bond between the layers of the elements of the array produces minimum distortion of the acoustic energy being transmitted through the elements. It is a still further object of the invention to provide a transducer array which can be manufactured to be more reproducible than those of the prior art.

These and other objects are obtained in this invention by providing an improved bond between the layers of the transducer elements. More particularly, the layers are bonded together with gold bonding instead of epoxy bonding to provide the objectives and desirable features of the invention. It is a feature of this invention that the gold bonding is accomplished at relatively low temperature and pressure. It is a further feature of the invention that the quality of the gold bonding is such that it prevents the formation and/or the propagation of cracks in the layers during the sawing operation in the formation of the array.

An ultrasonic transducer and its method of manufacture is described wherein the bonding between a layer of transducer material and an acoustic matching glass layer on one side of the transducer material and a supporting base on the other side of the transducer material, typically PZT, is made by first providing onto each material a smooth, thin gold layer on the smooth surfaces of the glass layer, PZT layer, and the base which are to be in contact with one another in the assembled transducer. The gold films on the surfaces of the glass layer, PZT layer, and base are forced in contact with one another under moderate pressure and temperature. The gold bonds so produced can withstand the stress of dicing with a diamond saw to produce an array of transducers which retain their bond strength in the water environment where conventional epoxy bonds frequently fail.

BRIEF DESCRIPTION OF THE DRAWINGS

The aforementioned aspects and other features of this invention are explained in the following description taken in conjunction with the accompanying drawings, wherein:

FIG. 1 is a projection view of a prior art transducer;

FIG. 2 is an exploded view showing the components of a transducer before assembly and fabrication into a transducer array according to the method of this invention; and FIG. 3 is a perspective view of the assembled transducer array of this invention made according to the method of this invention.

DETAILED DESCRIPTION OF THE INVENTION

A transducer array of this invention is shown in exploded view in FIG. 2 and in assembled view in FIG. 3. A gold film 22 is used as the bonding agent to bond together the glass layer 13, the PZT layer 10, and the supporting base 15, typically lead, to form a transducer assembly which after sawing cuts 19 transverse to the glass and PZT layers produced by a diamond saw as in the prior art produces the transducer elements 18 forming the array 17 of the transducer 20 of FIG. 3 typically having the same dimensions as in the prior art The PZT layer 10 is smaller than the glass layer 13 in order to expose the gold film 22A of the glass layer 13 and thereby provide a convenient point of attachment of wires 12 to the gold bonding film 22A of each transducer element 18 at the glass-PZT layer interface. Since the base 15 is in electrical contact with each element 18 through the metallic films 22, 23, electrical contact to all elements 18 is made by one wire 12' connected to lead layer 15.

The wires 12 are typically 3 mil diameter gold wires which are thermocompression bonded to the gold film 22A. Since the glass layer 13 overhangs the piezoelectric layer 10, a layer of plastic (not shown) applied to the encapsulate transducer 20 either before or after the saw cutting operation is desirable to strengthen the overhanging glass portion 8 and wires 12. Alternatively, instead of the glass layer 13 overhanging layer 10 as in FIG. 3, the glass layer may be slightly smaller than the piezoelectric layer 10. In this case, the wires 12 are bonded to the gold film 22 attached to the piezoelectric layer 10.

The surfaces of the glass 13, PZT 10, and lead 15 layers to which a gold bonding film 22 is to be applied must initially be made sufficiently smooth so that the gold film 22 to be made thereon will be thin and also smooth. Because gold does not bond well to most materials, it is desirable to first apply a metal film 23 which adheres well to both the layers 10, 13, 15 and to the gold film. Suitable materials for the film 23 are chromium, molybdenum and titanium.

The PZT layer 10 is a ceramic material and is given a commercial polish typical of ceramic materials, the polish will be imperfect due to pullouts, grain boundaries, and other properties. It is desired that the polish result in a smoothness such that the actual surface area closely approximates the geometric area. Generally, this will be the case when there is a strong specular reflectance of the polished ceramic to the unaided eye. Flatness is not as critical as smoothness since the PZT layer will be thin, typically 250–1000 microns, and the layer will deform under slight fingertip pressure to conform to the surface to which it is being bonded. For relatively thick and unyielding pieces, a greater degree of flatness is needed otherwise any deformation will remain as stored energy in the completed bonding.

The glass impedance matching layer 13 need not be polished since it typically has a high surface perfection in its manufactured condition. The thickness of the glass layer is typically 100–400 microns, a quarter wavelength in the glass at the frequency at which the transducer is to operate, and hence is also compliant so that flatness is not absolutely required although it is desirable.

The lead support plate 15 has its surface prepared by first machining the surface flat and then briefly chemically-mechanically polishing using a 1:1 acetic acid-hydrogen peroxide solution on a polishing cloth. Polishing of the lead is not as critical as the polishing of the PZT since the lead is soft and deformable. The lead layer will have a specular reflectance with no remaining machining marks after briefly wiping with the polishing cloth. The glass, polished PZT and lead substrates are cleaned and then mounted in a vacuum metallization chamber.

The cleaning process comprises a vapor degreasing typically with a Freon type of fluorinated hydrocarbon, if the surfaces are excessively dirty, greasy, etc. This step is followed with a washing in a suitable detergent (Alkanox, for example) using distilled water, rinsing in distilled water and propanol, and blow drying with filtered nitrogen. These steps remove particulate contamination from the substrate surfaces. The substrates are also exposed to ultra-violet light in air or oxygen to remove the last remaining monolayers of hydrocarbon contamination which may not have been removed by the preceding steps. Typically, the ultra-violet exposure consists of approximately 5 minutes exposure to a low pressure mercury lamp. The cleaning includes briefly exposing the surfaces to a radio frequency generated argon plasma which helps to clean the surfaces and in particular removes any loosely adherent lead oxide film from the surface of the lead layer. Since the lead layer very quickly forms an oxide which prevents good adhesion of the chromium film, the plasma cleaning step should precede, without delay, the step of forming the chromium film.

The metallization step comprises reducing the pressure within the vacuum metallization chamber to approximately $10^7$ Torr before starting evaporation. The substrates are then coated with chromium followed by coating with gold. Typical thicknesses found satisfactory are 300 Å of Cr and 2000 Å of Au. The thicknesses are not critical. The metal depositions are onto unheated substrates to avoid granular deposits. The rougher the surface of the substrate the thicker must be the metallization layer in order to insure adequate surface coverage for good bonding, preferably not more than 3000 Å total chrome and gold thickness. However, thicker deposits have been found to produce rougher surfaces which reduce the adhesive properties. Thus, the films should be only sufficiently thick to insure good adhesion on a polished surface with thicker layers being required on rougher surfaces. The substrates should be slightly warm, 50–60° C., when the substrates are removed from the vacuum system after the vacuum has been allowed to increase to atmospheric pressure with dry nitrogen. Slightly warm substrates tend to pick up less water vapor when exposed to the atmosphere and to therefore form less of an oxide layer on the gold surfaces of the substrates. An oxide layer makes bonding of gold to gold more difficult.

After removal from the vacuum metallization chamber the glass 13, the PZT 10, and the lead 15 should be placed in contact with one another as soon as possible and bonded together under moderate temperature and pressure. If it is necessary to store the substrates for a brief time, it is best to maintain them at elevated temperatures of at least 50–60° C. It has been found that substrates which have been left uncontacted for approximately 15 minutes in a typical class 100 enclosure may be bonded with only fingertip force. A Class 100 enclosure is a "clean room" or "work station" having a maximum number of one-hundred particles of one-half micron or larger and substantially no airborne particles of five microns or more in diameter per cubic foot of air or gas as defined by Federal Standard No. 209B. The term "clean filtered air" as employed elsewhere in this application shall therefore be defined as filtered air having substantially no particles greater than five microns in diameter and no more than one-hundred particles of one-half micron or larger per cubic foot of air or gas.

The minimum amount of bonding force and temperature required to achieve bonding has been found to be no greater than fingertip pressure (approximately 10 psi) at a temperature of approximately 50° C. and is dependent upon the roughness of the gold layer on each of the surfaces to be bonded and the degree of absence of hydrocarbons and oxides on the gold films. Where the surfaces are less than optimal because of roughness or contamination, the gold bond may be improved by increasing the temperature and pressure. A temperature of 80° C. and a pressure of 20 psi applied for approximately two hours is typical. If there is a large thermal expansion mismatch between the layers to be bonded, an increase in pressure instead of temperature is to be preferred. Hydrocarbons which may contaminate the gold surfaces may be removed by the exposure to ultraviolet light for approximately 5 minutes after which the layers may be placed in contact with one another and pressure and temperature bonded.

In summary, the invention provides a method for bonding materials to one another with a minimum pressure and temperature by providing a smooth and clean gold film on an underlying chrome fiIm and the material surfaces. These objectives of smoothness and cleanliness of the gold films have been achieved in this invention by proper surface polishing, cleaning, and metallization techniques. Thus, many structures of brittle material other than the transducer of the preferred embodiment may be fabricated by gold bonding following the technique described in this invention whereas heretofore gold bonding was not a practical method for bonding such materials because of the high pressures and temperatures required where the gold film was not smooth.

Although the invention has been described in the context of the fabrication of a transducer having a lead backing material, the lead backing may be replaced by other suitable materials, such as tungsten-plastic composites or other acoustically absorbing material which is matched to PZT, which will broadband the transducer and which can be plated with gold. Further, although the metallic layer which is initially applied to the substrates is chrome in the preferred embodiment, molybdenum or titanium among other metals also may be used in bonding the gold to the substrate while still providing a smooth surface. The chrome, molybdenum, or titanium film is desired because it has been found to improve the gold bond for most materials including those of the preferred embodiment of the invention. Since Cr, Mo and Ti bond well with most substrates and form an alloy with the subsequently deposited gold film, they provide a good bond of the gold to the substrate.

While the invention has been described in the context of forming a transducer, it will be appreciated by those skilled in the art of bonding that the adhesion or bonding of smooth layers of material by the bonding of smooth gold films on the layers in accordance with the invention may be applied to other devices, and that the invention is not to be limited solely to the bonding of the layers of a transducer.

It should be further recognized that since the gold film produces a good bond without producing acoustic discontinuities, the transducer may be fabricated of a plurality of quarter-wave matching layers at norminal operating frequencies, each layer being of a suitable index of refraction and each layer having a gold film for bonding. Such a plurality of matching layers results in broader band matching than is obtained by using a single quarter-wave layer of glass as in the described embodiment.

Having described a preferred embodiment of the invention it will be apparent to one of skill in the art that other embodiments incorporating its concept may be used. It is believed therefore that this invention should not be restricted to the disclosed embodiment but rather should be limited only by the spirit and scope of the appended claims.

What is claimed is:

1. A method for bonding materials comprising the steps of:

polishing surfaces of said materials to provide such surfaces with a predetermined degree of smoothness;

depositing in a vacuum of a vacuum chamber apparatus a smooth and clean gold film on each of said polished surfaces; and without allowing a substantial exposure of said surfaces to contamination above that of a Class 100 atmosphere, removing said materials from said vacuum apparatus and thereafter bonding said surfaces together by:

placing the gold film deposition on each of said surfaces in contact with one another;

applying a low pressure force transversely to the surfaces of said materials sufficient to bond the materials;

said polished step includes the step of measuring the degree of smoothness;

said step of depositing the gold film includes the prior step of depositing on each said surfaces a film of a metal adherent to said materials and to which said gold film is adherent;

said step of depositing said film of adhering material is preceded by cleaning the surfaces of said materials in a non-vacuum after said polishing step; and said cleaning step comprises the steps of washing said surfaces in a detergent in distilled water, rinsing in distilled water, and blow drying with nitrogen.

2. The bonding method of claim 1 wherein said washing step is preceded by a vapor degreasing step comprising using a fluorinated hydrocarbon.

3. The bonding method of claim 1 wherein said drying step is followed by exposing said surfaces to be bonded to ultra-violet light for a time sufficient to remove hydrocarbon contamination.

4. The bonding method of claim 3 wherein said ultraviolet exposing step is followed by exposing the surfaces to be bonded to a plasma cleaning step.

5. The bonding method of claim 4 wherein said plasma is an RF argon plasma.

6. The bonding method of claim 1 wherein said step of placing the gold film of each surface to be bonded in contact with one another is preceded by exposing the gold film to ultra-violet light.

7. The bonding method of claim 1 comprising in addition:

allowing the vacuum to decrease to atmospheric pressure with dry nitrogen before removing said materials from said vacuum apparatus.

8. The method of claim 1 comprising in addition:

maintaining the temperature of the materials above room temperature prior to and during the time they are removed from said vacuum apparatus.

9. The method of claim 8 wherein the temperature of the materials is maintained at 50–60° C.

10. The method of claim 1 comprising in addition:

exposing to ultraviolet light the gold surfaces for a time sufficient to remove hydrocarbons deposited thereon prior to said bonding step.

11. The bonding method of claim 1 wherein:

said at least one of said materials is lead;

said cleaning step is preceded by the step of chemical-ly-mechanically polishing using a 1:1 acetic acid-hydrogen peroxide solution on a polishing cloth;

exposure the cleaned lead surface to a radio frequency generated argon plasma just prior to depositing said film of adhering metal.

12. A method for bonding materials comprising the steps of:

polishing surfaces of said materials to provide such surfaces with a predetermined degree of smoothness;

depositing in a vacuum of a vacuum chamber apparatus a smooth clean gold film on each of said polished surfaces;

placing the gold film deposition on each of said surfaces in contact with one another;

applying a low pressure force transversely to the surfaces of said materials sufficient to permanently bond the materials;

said step of depositing the gold film includes the prior step of depositing on each of said surfaces a film of a metal adherent to said materials and to which said gold film is adherent;

said metal is selected to form an alloy with said gold film;

said step of depositing said film of adhering metal is preceded by cleaning the surfaces of said materials in a non-vacuum after said polishing step; and maintaining said gold surfaces above room temperature from a time prior to their removal from said vacuum apparatus up to said bonding step.

* * * * *